United States Patent
Peterlechner

[19]
[11] Patent Number: 6,031,224
[45] Date of Patent: Feb. 29, 2000

[54] POSITION MEASURING SYSTEM

[75] Inventor: Andreas Peterlechner, St. Radegund, Austria

[73] Assignee: Johannes Heidenhain GmbH, Traunreut, Germany

[21] Appl. No.: 09/124,873

[22] Filed: Jul. 30, 1998

[30] Foreign Application Priority Data

Jul. 30, 1997 [AT] Austria ................................ A 1290/97

[51] Int. Cl.$^7$ .......................... G01B 11/00; G01D 5/347
[52] U.S. Cl. ................................ 250/231.13; 250/231.15; 356/373
[58] Field of Search ................... 250/231.13, 231.14, 250/231.15, 231.16, 231.17, 231.18, 237 G, 237 R; 356/573, 574, 575; 340/600, 659, 669, 661, 670, 671, 672, 686; 341/3, 13, 14, 15, 16

[56] References Cited

U.S. PATENT DOCUMENTS

| | | | |
|---|---|---|---|
| 4,388,613 | 6/1983 | Rush et al. | 341/14 |
| 4,945,231 | 7/1990 | Ohya et al. | 250/231.14 |
| 4,970,387 | 11/1990 | Kuba et al. | 250/231.14 |
| 5,091,643 | 2/1992 | Okutani et al. | 250/231.14 |
| 5,428,445 | 6/1995 | Holzapfel | 250/231.14 |
| 5,841,133 | 11/1998 | Omi | 250/231.13 |

FOREIGN PATENT DOCUMENTS

| | | |
|---|---|---|
| 396 840 | 12/1993 | Austria . |
| 0 421 131 | 4/1991 | European Pat. Off. . |
| 20 46 332 | 1/1979 | Germany . |
| 35 26 206 | 2/1987 | Germany . |
| 5-15213 | 6/1993 | Japan . |
| 2 090968 | 7/1982 | United Kingdom . |

*Primary Examiner*—John R. Lee
*Attorney, Agent, or Firm*—Brinks Hofer Gilson & Lione

[57] ABSTRACT

A position measuring system including a scale and a scanning unit for scanning the scale and movable relative to the scale in a measuring direction, for generating position-dependent measuring signals, the scanning unit including a pattern with first and second sections. A reference track including a first field on one side of a reference position, and a second field which is different from the first field and located on the other side of the reference position, wherein when the first field of the reference track is scanned by the pattern of the scanning unit, a continuously strong scanning signal is generated and when the second field of the reference track is scanned by the pattern of the scanning unit a continuously weak scanning signal is generated. A module to which the scanning signal of the reference track is supplied and forms a characteristic signal.

10 Claims, 6 Drawing Sheets

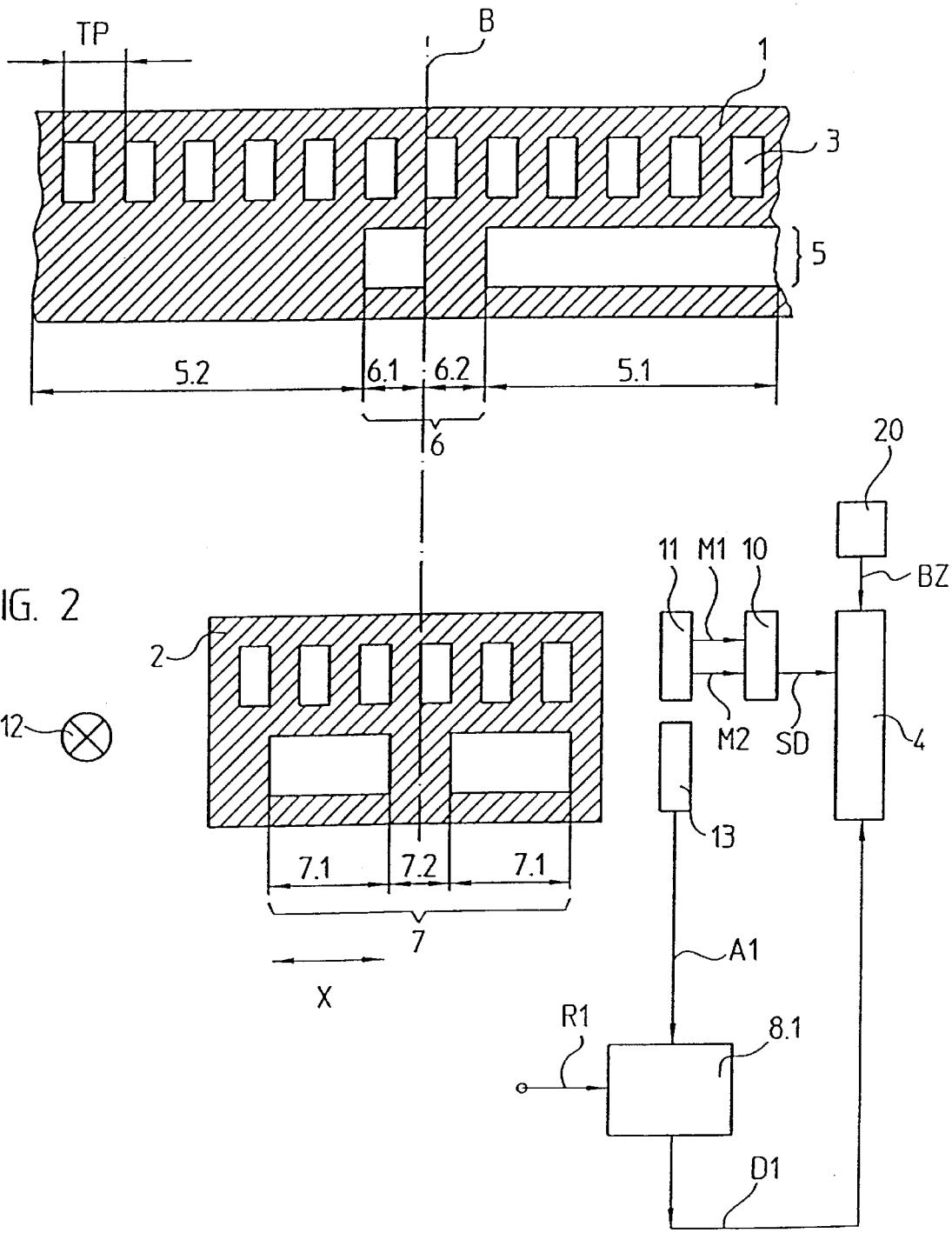

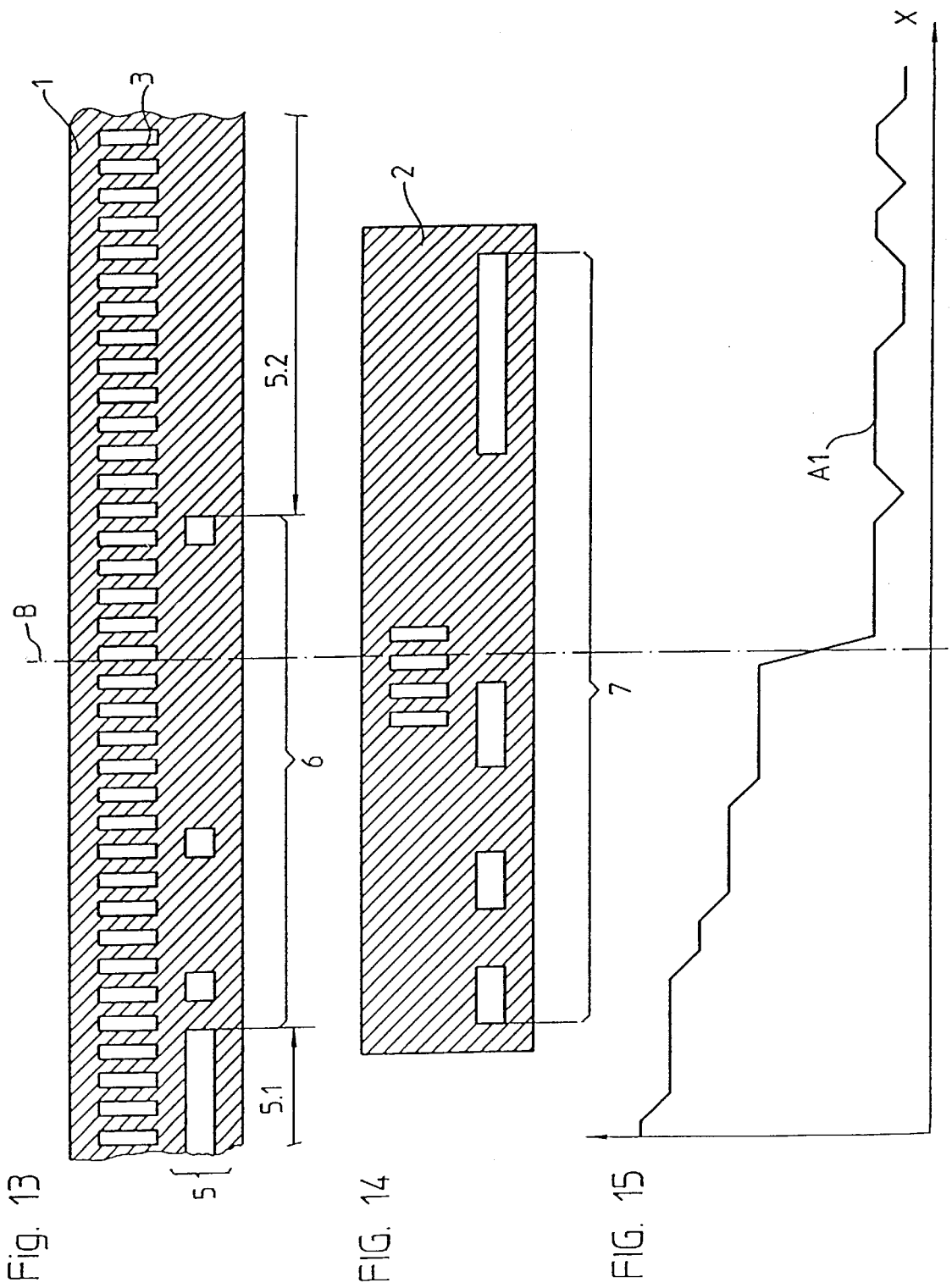

POSITION MEASURING SYSTEM

Applicant claims, under 35 U.S.C. § 119, the benefit of priority of the filing date of Jul. 30, 1997 of an Austrian patent application, copy attached, Serial Number 1290/97, filed on the aforementioned date, the entire contents of which are incorporated herein by reference.

BACKGROUND OF THE INVENTION

1. Field of the Invention

The present invention relates to a position measuring system having a scale, on which an incremental graduation with a graduation period is provided, an interpolation unit, a counter, a reference track and a module for comparing the scanning signal of the reference track with a reference signal.

2. Discussion of Related Art

A position measuring system of this type is known from German Patent Publication DE 35 26 206 A1. A measurement representation in the form of an incremental graduation and a reference track with a continuously transparent field and an immediately following continuously opaque field is provided on a scale. This reference track is scanned by a window of a scanning unit in order to obtain a continuously weak scanning signal in the transparent field and a continuously strong scanning signal in the opaque field and to distinguish the two fields from each other in this way.

This arrangement has the disadvantage that in the course of scanning the transition from the opaque to the transparent field, the scanning signal increases relatively slowly. To achieve a dependable differentiation between the two field sections by means of a scanning signal it is necessary that the difference between the continuously weak and strong scanning signals be as large as possible. In accordance with the prior art this can be achieved by employing a window of the scanning unit which is relatively long in the measuring direction.

However, the result of using a window relatively long in the measuring direction is that the transition area of the scanning signal from the low to the high signal level is relatively broad. It is not possible to clearly determine a reference position by means of the scanning signal, because of which a separate reference marker is required. It is also not possible to clearly distinguish the two field sections to the right and left of the reference position by means of the scanning signal resulting from scanning the reference track and the reference marker.

A further position measuring system is known from Austrian Patent Publication AT 396 840 B, wherein continuous transparent and opaque field sections are placed next to an incremental graduation on a scale for distinguishing between the right and the left section of a reference position. In one reference track the field sections are arranged in a sequence of transparent and opaque, and complementary thereto in a second reference track opaque and transparent. At the reference position both reference tracks are transparent. A scanning signal is generated from each of the two reference tracks, and the two scanning signals are switched so that they differ.

In this arrangement the resulting scanning signal also rises relatively slowly, and the two reference tracks increase the structural size of the position measuring system.

A photoelectric device for the mutual alignment of two objects is described in German Patent Publication DE 20 46 332 C3. Two parallel reference tracks are arranged on one of the two objects and each reference track is scanned by a pattern of a scanning unit. Each reference track consists of a transparent and an opaque continuous field. Each reference track is designed with a pattern of a series of transparent and opaque fields at the transition between the two fields. The pattern of the scanning unit is complementary to this pattern. In the course of the movement of the scanning unit from the opaque field of a reference track to the transparent field of this reference track a state is achieved in which a steep rise of the scanning signal takes place because several transparent fields of the reference track simultaneously change from a non-overlapping state with the transparent fields of the scanning unit to an overlapping state. However, it is disadvantageous that it is not possible to determine a clear reference position by means of this scanning signal, since equal signal levels are being generated at several locations in the transition area. In order to rule out this ambiguity, the two scanning signals of the two reference tracks are switched so that they differ. The difference signal only has one unambiguous steeply rising section. However, it is disadvantageous that the difference between the low and the high signal level is very small because of this. Furthermore, two reference tracks and two scanning windows are required for generating the difference signal, which increases the structural size. The two reference tracks are arranged vertically in respect to the measuring direction at a distance from each other, which has the result that the difference signal is considerably affected by tilting between the scanning unit and the support of the reference tracks. The steeper the signal rise of the difference signal, the more sensitive the device is to tilting, since even with small tilts the difference signal can become zero within a large area.

An absolute position measuring system with several code tracks is described in Japanese Patent Publication JP 5-15213 B2. Each code track consists of alternating opaque and transparent fields. A pattern of successive transparent and opaque fields is provided at the respective transition between two fields, which is scanned by a pattern of the scanning device in order to obtain as steep as possible a signal rise of the analog scanning signals. The analog scanning signals are digitized and an absolute code word is formed. In connection with an exemplary embodiment, an incremental track is arranged parallel with the code tracks. However, none of the transitions between the opaque and transparent fields are used for generating a reference signal which is associated with a counting signal derived from the incremental graduation. Also, no steps and means for achieving such a definite association are recited. Therefore the transition between two fields does not constitute a reference marker.

SUMMARY OF THE INVENTION

One aspect of the present invention regards a position measuring system includes a scale on which an incremental graduation with a graduation period is provided. A scanning unit for scanning the scale and movable relative to the scale in a measuring direction, for generating positiondependent measuring signals, the scanning unit including a pattern with first and second sections. An interpolation unit which is supplied with the measuring signals and in which each graduation period is divided into several sections, wherein each section corresponds to a counting step. A counter for adding the counting steps during scanning of the incremental graduation by the scanning unit. A reference track including a first field on one side of a reference position, and a second field which is different from the first field and located on the other side of the reference position, wherein when the first field of the reference track is scanned by the pattern of the scanning unit, a continuously strong scanning signal is generated and when the second field of the reference track is scanned by the pattern of the scanning unit a continuously weak scanning signal is generated. The reference track also includes a pattern provided at the reference position between the first and second fields, wherein the pattern of the reference track has a series of first and second fields, wherein when the pattern of the reference track is scanned by the pattern of the scanning unit, the scanning signal is proportional to the amount of overlapping of the first field of the reference track and the first section of the pattern of the scanning unit the patterns of the reference track and the scanning unit are dimensioned in such a way that during the movement of the scanning unit from one side of the reference position to the other side of the reference position a steep rise of the scanning signal takes place in that simultaneously several first fields of the reference track and the pattern of the reference track make a transition from a non-overlapping state with the first sections of the scanning unit into an overlapping state, and that with continued scanning of the pattern of the reference track the amount of overlapping becomes always larger than in the course of the scanning of the pattern of the reference track ahead of the reference position. A module to which the scanning signal of the reference track is supplied and which compares the scanning signal with at least one reference signal and forms a characteristic signal having a characteristic which is unambiguously associated with a counting step of the incremental graduation. The counting step defines the reference position for the incremental measurement in that, when the characteristic appears, the count of the counter is set to a predetermined value, and the level of the scanning signal on the one side of the reference position continuously differs over a multitude of graduation periods from the signal level on the other side of the reference position.

One advantage of the present invention is that it is designed simply and in a space-saving manner.

Another advantage of the present invention is that measuring sections on both sides of a reference position can be unambiguously distinguished from each other by means of the signal level of a scanning signal.

A third advantage of the present invention is that the scanning signal has a large rise at the transition between one and the other measuring section in order to be able to determine a reference position unambiguously and highly accurately in accordance with the counting step of the incremental position measurement.

A fourth advantage of the present invention is that it requires only one reference track on the scale for the unambiguous differentiation between several measuring sections, and that the scanning signal has a large rise at the transition between these measuring sections.

A fifth advantage of the present invention is that a reference position can be derived from the scanning signal, which can be unambiguously associated with a counting step.

Further advantages and details of the scanning element according to, the invention will become apparent from the ensuing description of an exemplary embodiment in conjunction with the accompanying drawings.

BRIEF DESCRIPTION OF THE DRAWINGS

FIG. 1 represents a scale of a first embodiment of a position measuring system according to the present invention;

FIG. 2 represents a scanning unit for scanning the scale in accordance with FIG. 1;

FIG. 13 represents a scale of a second embodiment of a position measuring system according to the present invention;

FIG. 14 represents a scanning unit for scanning the scale in accordance with FIG. 13;

FIG. 15 represents a signal progression of the scanning signal of the scanning unit in accordance with FIG. 14;

DESCRIPTION OF THE PREFERRED EMBODIMENT

Figure 3:
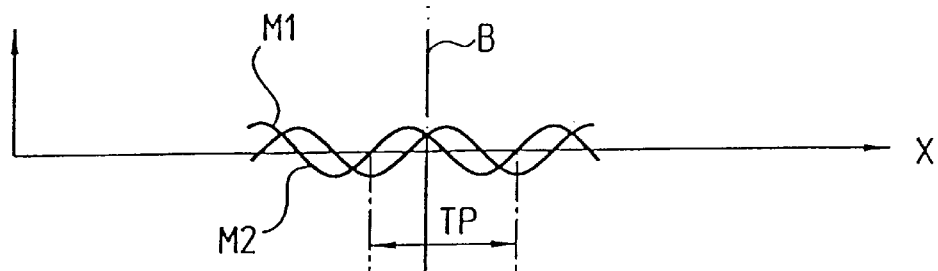
FIG. 3 represents a signal progression of the analog incremental measuring signals of the scanning unit in accordance with FIG. 2.
Figure 4:
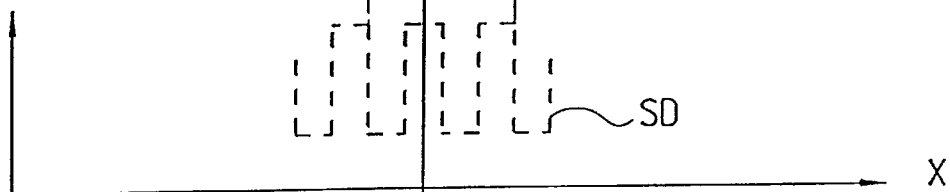
FIG. 4 represents the counting signals derived from the measuring signals in accordance with FIG. 3 in digital form.

A first exemplary embodiment of the invention is represented in FIGS. 1 to 6. A scale 1 is represented in FIG. 1, and a scanning unit 2 for scanning the scale 1 is represented in FIG. 2. A measurement representation in the form of an incremental graduation 3 of the graduation period TP is provided on the scale 1. The incremental graduation 3 consists of transparent and opaque sections arranged periodically in the measuring direction X. For scanning the incremental graduation 3, the scanning unit 2 is displaced in a known manner in respect to the scale 1 in the measuring direction X and in M the process several analog measuring signals Ml, M2, which are phase-shifted in respect to each other and are interpolated, are generated by the scanning unit 2. The interpolation is performed in an interpolation unit 10 by dividing each graduation period TP into several sections, wherein each section corresponds to a counting step Z. Thus, a counting step Z is a fraction of a period TP of the measuring signals M1, M2. In the example, the analog measuring signals M1, M2 are two sinusoidal scanning signals, which are phase-shifted by 90° in respect to each other, as represented in FIG. 3. A digitized measuring signal SD is represented in FIG. 4, which had been created by the interpolation of the analog, sinusoidal measuring signals M1, M2 of the photo-detectors 11. This position-dependent measuring signal SD is supplied to a counter 4 which determines the instantaneous position of the scanning unit 2 in relation to the scale 1 in a highly accurate manner by means of counting the edges of the digital measuring signals SD. The distance between two edges which can be counted corresponds to one counting step Z.

Next to the incremental graduation 3 on the scale 1, there is a reference track 5 with continuous, differently designed fields 5.1 and 5.2 arranged one behind the other in the measuring direction X. One field 5.2 is opaque and the other field 5.1 is transparent. Each field 5.1 and 5.2 extends over a multitude of graduation periods TP of the incremental graduation 3. A pattern 6 of transparent fields 6.1 and opaque fields 6.2 following each other in the measuring direction X is provided at the transition between the opaque field 5.2 and the transparent field 5.1.

Figure 5:
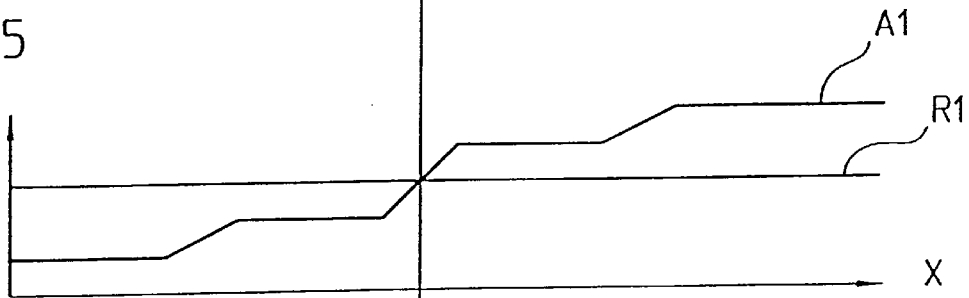
FIG. 5 represents the analog scanning signal of the reference track in accordance with FIG. 1.

For scanning the reference track 5, the scanning unit 2 has a pattern of transparent sections 7.1 and opaque sections 7.2 following each other in the measuring direction X. Viewed in the measuring direction X, the transparent sections 7.1 are at least twice as wide as the transparent fields 6.1 of the pattern 6 of the reference track 5. A light source 12, a photo-detector 13 and the top view of a scanning plate of the scanning unit 2 are represented only schematically in FIG. 2. In a manner known per se, the photo-detector 13 is associated with the scanning plate for generating a scanning signal A1 when scanning the reference track 5. The analog scanning signal A1 generated by the photo-detector 13 is represented in FIG. 5. It can be seen that in the course of the movement of the scanning unit 2 starting from the left opaque field 5.2, a low continuous signal level is created. When a transparent section 7.1 of the scanning unit 2 reaches a transparent field 6.1 of the reference track 5, the level of the scanning signal A1 rises slightly. The pattern 6 of the reference track 5 and the pattern 7 of the scanning unit 2 are matched to each other in such a way that in the course of the movement of the scanning unit 2 from the opaque field 5.2 in the direction toward the transparent field 5.1 the level of the scanning signal A1 rises steeply at a reference position B. This is achieved in that at this reference position B several transparent sections 7.1 of the pattern 7 of the scanning unit 2 change from a non-overlapping state to an overlapping state simultaneously with transparent fields 6.1, 5.1 of the reference track 5 of the scale 1. In the example represented, these are two sections 7.1 which overlap simultaneously with transparent fields 6.1, 5.1 of the scale 1. The more transparent fields 6.1 and transparent sections 7.1 are available, the steeper the signal level in the area of the reference position B will rise, and the more accurately can the reference position B be obtained from the scanning signal A1.

Figure 6:
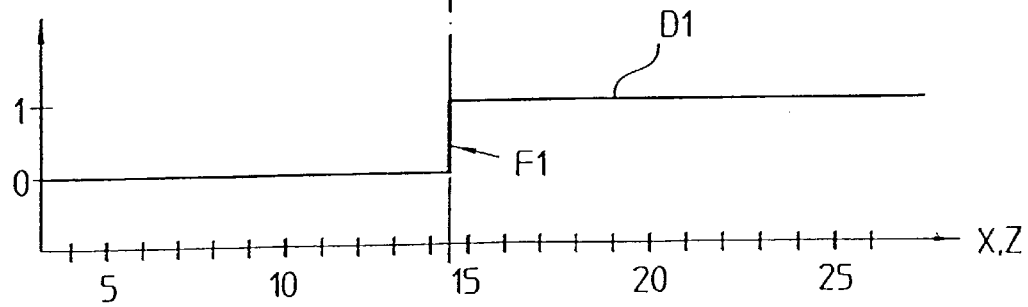
FIG. 6 represents the scanning signal in accordance with FIG. 5 in a digital form.
Figure 7:
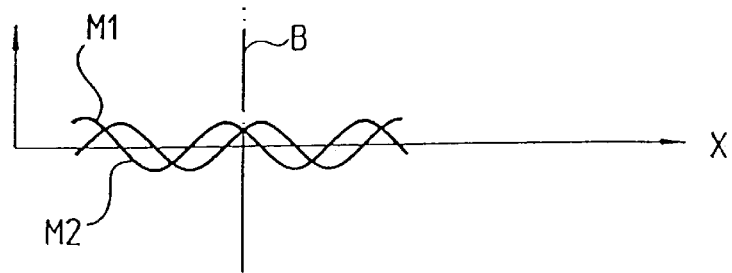
FIG. 7 represents the signal progression of the analog incremental measuring signals of the scanning unit in accordance with FIG. 2.
Figure 8:
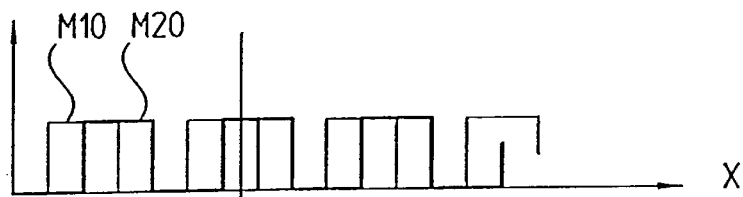
FIG. 8 represents the digitized measuring signals from FIG. 7.

In the example represented, the reference position B is obtained by triggering the analog scanning signal A1, in that the analog scanning signal A1 is compared with a reference signal RI in a comparator 8.1. A digital signal D1 is present at the output of the comparator 8.1 and is represented in FIG. 6. At the reference position B, the signal D1 has a characteristic in the form of a rising edge F1, which is unambiguously associated with a predetermined counting step BZ. On the left side of the reference position B this signal D1=0, and in the right area this signal D1=1. By means of the signal A1, or respectively D1, it is possible to determine at any arbitrary relative position between the scanning unit 2 and the scale 1, whether the scanning unit 2 is to the right or the left of the reference position B. It is possible in any arbitrary position to specifically approach the reference position B. With incremental, relatively measuring systems, the unambiguous determination of the reference position B is necessary in order to be able to relate the measurement to a defined scale location (reference position). The reference position B is used to restore an absolute position measurement value in relation to the reference position B after interruptions in the operation or loss of current. To this end, the counter 4 is set to the predetermined reference count BZ when the edge F1 of the signal D1 appears. In this case this reference count BZ is transferred from a memory 20 to the counter 4. In the example represented, the counter 4 must be set to the reference count BZ=15 in order to be able to count forward again, starting correctly at the reference position B. The reference count BZ can also have a different value, for example BZ can equal 0. In connection with angle measuring systems it is additionally possible to trigger a revolution counter by means of the scanning signal D1, A1 generated at the reference position B.

The patterns 6 and 7 of the scale 1 and the scanning unit 2, respectively, are furthermore matched to each other in such a way that during scanning the pattern 6, after passing through the steep rise, the scanning signal A1 no longer drops below a level which is equal to or lower than the level of the scanning signal A1 prior to passage through the steep rise during scanning of the pattern 6. This means that prior to reaching the reference position B, fewer and fewer transparent fields 6.1 overlap transparent sections 7.1, or respectively fewer transparent surfaces, than after reaching the reference position B.

The number of fields 6.1 and sections 7.1 which simultaneously change into the overlapping state determines the rise of the scanning signal A1 in the area of the reference position B. It has been selected in such a way that during the operation of the position measuring system the transition of the digital scanning signal D1 for 0 to 1 always lies within a defined counting step Z. In the example represented, the reference position B is associated with the counting step Z=15 (count of the counter). This association must also be assured in case of temperature changes, soiling and aging.

A further exemplary embodiment will be explained by means of FIGS. 7 to 12. It is shown how a signal D3 can be formed from the analog scanning signal A1, which has a characteristic F2, which is unambiguously associated with the counting step Z of the incremental graduation 3. To this end, two digital measuring signals M10, M20, which are phase-shifted by 90° in respect to each other (FIG. 8), are formed from the analog measuring signals M1, M2 in FIG. 7, which are again represented. A period TP is divided into several sections by this digitalization. This division into, for example four, sections already is an interpolation. Each one of these sections again corresponds to a counting step Z.

Figure 9:
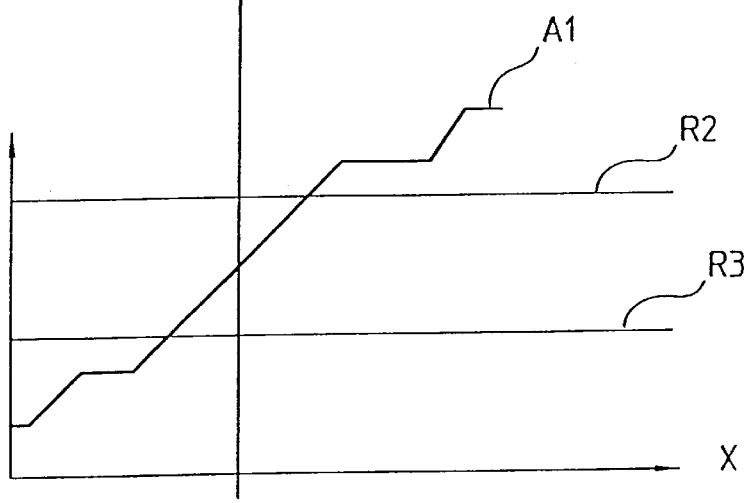
FIG. 9 represents the analog scanning signal of the reference track in accordance with FIG. 2.
Figure 10:
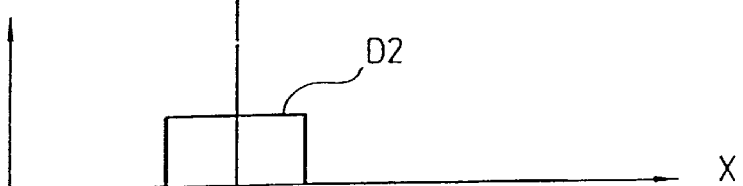
FIG. 10 represents the digitized scanning signal of the reference track.
Figure 11:
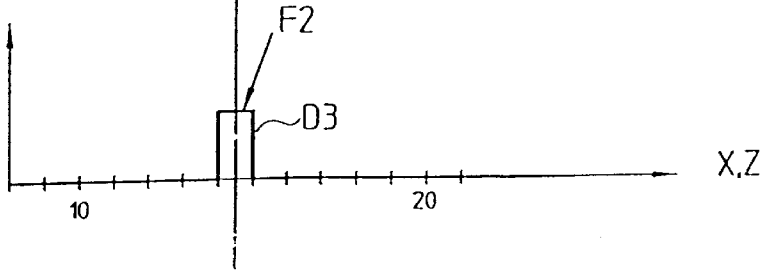
FIG. 11 represents the digitized scanning signal in accordance with FIG. 10 logically linked with the measuring signals in accordance with FIG. 8.
Figure 12:
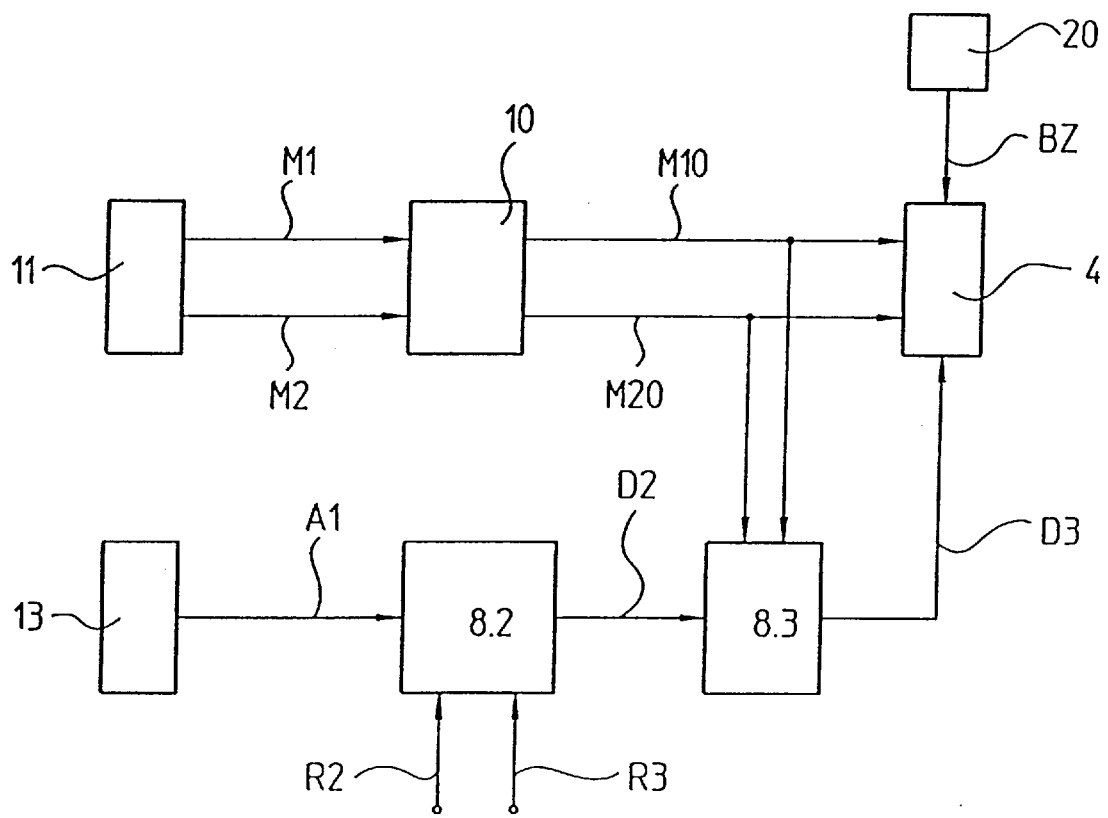
FIG. 12 represents a circuit for processing and generating the signals in accordance with FIGS. 7 to 11.

The analog scanning signal A1 of the reference track 5 is represented in FIG. 9. This scanning signal A1 is compared with two reference signals R2, R3 in a comparator 8.2, represented in FIG. 12, by means of which a digital signal D2 is generated. The signal D3 is generated by means of a logical AND linkage of M10 and M20 and D2, whose high level F2 has a width which corresponds to the width of a counting step Z and therefore is unambiguously associated with a counting step Z. The logical linkage is performed in the logic circuit 8.3 (FIG. 12).

In the described examples, a counting step Z=0.25×TP. If the analog measuring signals obtained by the scanning unit 2 are further interpolated, Z can also be a small fraction of Z, for example Z can be=0.05×TP or 0.02×TP. In order to be able to unambiguously associate the reference position B from the scanning signal A1 with a definite counting signal, even with these small counting steps Z, a plurality of fields 6.1 must contribute to the rise of the scanning signal A1 in the area of the reference position B. An example of a scale 1 designed for this is represented in FIG. 13. The scanning unit 2, which is correspondingly designed, is represented in FIG. 14. The analog scanning signal A1 generated in the course of the relative movement between the scale 1 and the scanning unit 2 is represented in FIG. 15.

In all of FIGS. 1 to 18 the same reference numerals were selected for elements operating in the same way.

Figure 16:
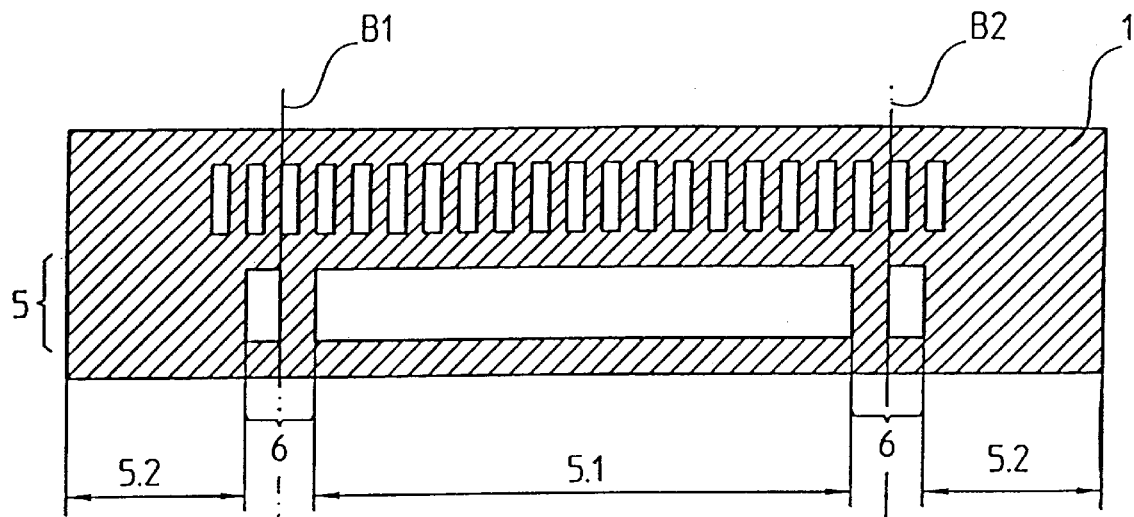
FIG. 16 represents a scale of a third embodiment of a position measuring system according to the present invention.
Figure 17:
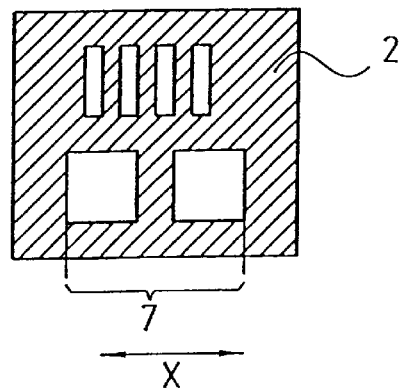
FIG. 17 represents a scanning unit for scanning the scale in accordance with FIG. 16.
Figure 18:
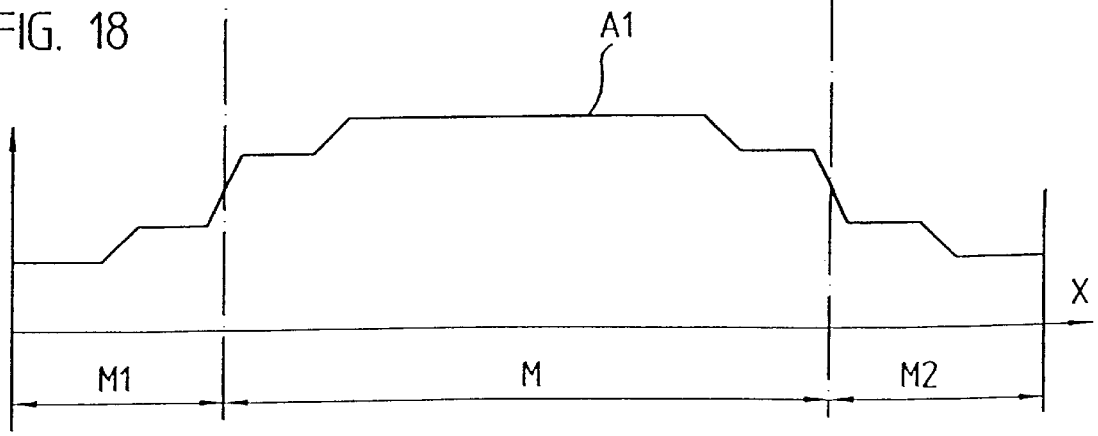
FIG. 18 represents a signal progression of the scanning signal of the scanning unit in accordance with FIG. 17.

In all examples explained so far, a reference marker signal F1, F2 is generated only at one reference position B along the scale 1. But in accordance with the invention it is also possible to define several reference positions B. An example of this is represented in FIGS. 16 to 18. The scale 1 has two reference positions BI, B2. The pattern 6 of the scale 1 and the pattern 7 of the scanning unit 2 are designed in accordance with FIGS. 1 and 2, so that further explanation in this regard can be omitted. When the scanning unit 2 is displaced relative to the scale 1 in the measuring direction X, the scanning signal A1 represented in FIG. 18 is generated. The reference positions B1, B2 define the limits of the permissible measuring section of the scale 1. They are used to define a measuring section M and end position sections M1, M2. The scanning signal A1 can be used to switch off a drive unit when the end position sections M1, M2 have been reached, in order to prevent collisions of machine elements.

In a manner not shown, the transparent sections 6.1 of the scanning plate 2 can also be directly designed as light-sensitive areas of a photodetector, and the opaque areas 6.2 as non-light- sensitive spaces between them.

In connection with all described examples, photoelectric scanning of the scale 1 in transmitted light takes place. However, the invention can also be used with incident light scanning, as well as in connection with other physical scanning principles, such as capacitatively or magnetically, for example.

The invention may be embodied in other forms than those specifically disclosed herein without departing from its spirit or essential characteristics. The described embodiments are to be considered in all respects only as illustrative and not restrictive, and the scope of the invention is commensurate with the appended claims rather than the foregoing description.

I claim:

1. A position measuring system comprising a scale, on which an incremental graduation with a graduation period is provided;

a scanning unit for scanning said scale and movable relative to said scale in a measuring direction, for generating position-dependent measuring signals, said scanning unit comprising a pattern with first and second sections;

an interpolation unit, which is supplied with said measuring signals and in which each graduation period is divided into several sections, wherein each section corresponds to a counting step, a counter for adding said counting steps during scanning of said incremental graduation by said scanning unit, a reference track comprising a first field on one side of a reference position, and a second field which is different from said first field and located on the other side of said reference position, wherein when said first field of said reference track is scanned by said pattern of said scanning unit, a continuously strong scanning signal is generated and when said second field of said reference track is scanned by said pattern of said scanning unit a continuously weak scanning signal is generated;

said reference track further comprising a pattern provided at said reference position between said first and second fields, wherein said pattern of said reference track comprises a series of first and second fields, wherein when said pattern of said reference track is scanned by said pattern of said scanning unit, said scanning signal is proportional to the amount of overlapping of said first field of said reference track and said first section of said pattern of said scanning unit, and said patterns of said reference track and said scanning unit are dimensioned in such a way that during the movement of said scanning unit from one side of said reference position to the other side of said reference position a steep rise of said scanning signal takes place in that simultaneously several first fields of said reference track and said pattern of said reference track make a transition from a non-overlapping state with said first sections of said scanning unit into an overlapping state, and that with continued scanning of said pattern of said reference track the amount of overlapping becomes always larger than in the course of the scanning of said pattern of said reference track ahead of said reference position, and a module, to which said scanning signal of said reference track is supplied and which compares said scanning signal with at least one reference signal and forms a characteristic signal having a characteristic which is unambiguously associated with a counting step of said incremental graduation, and said counting step defines said reference position for said incremental measurement in that, when said characteristic appears, the count of said counter is set to a predetermined value, and the level of said scanning signal on said one side of said reference position continuously differs over a multitude of graduation periods from said signal level on said other side of said reference position.

2. The position measuring system in accordance with claim 1, wherein said module comprises a comparator that is supplied with said scanning signal and with said reference signal, and which forms said characteristic signal that comprises an edge, which is unambiguously associated with said counting step defining said reference position.

3. The position measuring system in accordance with claim 1, wherein said module comprises a comparator that is supplied with said scanning signal and with two reference signals so as to form said characteristic signal that has a signal level that is unambiguously associated with said counting step defining said reference position.

4. The position measuring system in accordance with claim 3, wherein said comparator compares said scanning signal with said two reference signals and forms a signal.

5. The position measuring system in accordance with claim 4, wherein said module comprises a logic circuit that logically links said measuring signals with said signal generated in said comparator so as to form said characteristic signal that has a signal level that is unambiguously associated with said counting step defining said reference position.

6. The position measuring system in accordance with claim 1, wherein said scanning unit comprises:

a light source for illuminating said reference track, wherein said first fields of said reference track and said pattern of said reference track are transparent and said second fields of said reference track and said pattern of said reference track are opaque;

a scanning plate comprising said first section and said second section, wherein said first section is transparent and said second section is opaque; and a photo-detector for detecting the light passing through said first fields of said reference track, said first fields of said pattern of said reference track and said first sections of said scanning unit.

7. The position measuring system in accordance with claim 2, wherein said scanning unit comprises:

a light source for illuminating said reference track, wherein said first fields of said reference track and said pattern of said reference track are transparent and said second fields of said reference track and said pattern of said reference track are opaque;

a scanning plate comprising said first section and said second section, wherein said first section is transparent and said second section is opaque; and a photo-detector for detecting the light passing through said first fields of said reference track, said first fields of said pattern of said reference track and said first sections of said scanning unit.

8. The position measuring system in accordance with claim 3, wherein said scanning unit comprises:

a light source for illuminating said reference track, wherein said first fields of said reference track and said pattern of said reference track are transparent and said second fields of said reference track and said pattern of said reference track are opaque;

a scanning plate comprising said first section and said second section, wherein said first section is transparent and said second section is opaque; and a photo-detector for detecting the light passing through said first fields of said reference track, said first fields of said pattern of said reference track and said first sections of said scanning unit.

9. The position measuring system in accordance with claim 4, wherein said scanning unit comprises:

a light source for illuminating said reference track, wherein said first fields of said reference track and said pattern of said reference track are transparent and said second fields of said reference track and said pattern of said reference track are opaque;

a scanning plate comprising said first section and said second section, wherein said first section is transparent and said second section is opaque; and a photo-detector for detecting the light passing through said first fields of said reference track, said first fields of said pattern of said reference track and said first sections of said scanning unit.

10. The position measuring system in accordance with claim 5, wherein said scanning unit comprises:

a light source for illuminating said reference track, wherein said first fields of said reference track and said pattern of said reference track are transparent and said second fields of said reference track and said pattern of said reference track are opaque;

a scanning plate comprising said first section and said second section, wherein said first section is transparent and said second section is opaque; and a photo-detector for detecting the light passing through said first fields of said reference track, said first fields of said pattern of said reference track and said first sections of said scanning unit.

* * * * *